United States Patent
Kubo et al.

(10) Patent No.: US 11,171,086 B2
(45) Date of Patent: Nov. 9, 2021

(54) SEMICONDUCTOR DEVICE

(71) Applicant: RENESAS ELECTRONICS CORPORATION, Tokyo (JP)

(72) Inventors: Shunji Kubo, Tokyo (JP); Koichi Ando, Tokyo (JP); Eiji Io, Tokyo (JP); Hideyuki Tajima, Tokyo (JP); Tetsuya Iida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 59 days.

(21) Appl. No.: 16/700,485

(22) Filed: Dec. 2, 2019

(65) Prior Publication Data

US 2021/0167012 A1  Jun. 3, 2021

(51) Int. Cl.
| | |
|---|---|
| *H01L 23/522* | (2006.01) |
| *H01L 23/373* | (2006.01) |
| *H01L 21/768* | (2006.01) |
| *H01L 27/06* | (2006.01) |

(52) U.S. Cl.
CPC .... *H01L 23/5228* (2013.01); *H01L 21/76898* (2013.01); *H01L 23/3731* (2013.01); *H01L 23/3736* (2013.01); *H01L 23/5226* (2013.01); *H01L 27/0688* (2013.01)

(58) Field of Classification Search
CPC ... H01L 23/5228; H01L 23/647; H01L 28/20; H01L 21/76898; H01L 27/0629; H01L 27/0802; H01L 27/101; H01L 23/367
See application file for complete search history.

(56) References Cited

U.S. PATENT DOCUMENTS

| | | | |
|---|---|---|---|
| 10,069,466 B2* | 9/2018 | McPartlin | H01L 29/7325 |
| 10,354,951 B1* | 7/2019 | Kande | H01L 28/24 |
| 2012/0184080 A1* | 7/2012 | Lukaitis | H01L 27/1203 |
| | | | 438/384 |
| 2017/0012041 A1* | 1/2017 | Chong | H01L 21/76 |
| 2018/0375497 A1 | 12/2018 | Hashimoto et al. | |

FOREIGN PATENT DOCUMENTS

JP  2019-009345 A  1/2019

\* cited by examiner

*Primary Examiner* — Zandra V Smith
*Assistant Examiner* — Abbigale A Boyle
(74) *Attorney, Agent, or Firm* — McDermott Will & Emery LLP

(57) ABSTRACT

A semiconductor device includes a base member, a multilayer wiring layer, and a first resistive element. The multilayer wiring layer is formed on the base member. The first resistive element is formed in the multilayer wiring layer. The first resistive element includes a first conductive part, a second conductive part and a third conductive part. The second conductive part is formed over the first conductive part. The third conductive part electrically connects the first conductive part and the second conductive part with each other. A length of the third conductive part in a first direction along a surface of the base member is greater than a length of the third conductive part in a second direction along the surface of the base member and perpendicular to the first direction.

10 Claims, 11 Drawing Sheets

SEMICONDUCTOR DEVICE

BACKGROUND

It relates to a semiconductor device, for example, a semiconductor device including a resistive element formed in a multilayer wiring layer.

There is a disclosed technique listed below.

[Patent Document 1] Japanese Unexamined Patent Application Publication No. 2019-009345

A semiconductor device including a resistive element is known (see, for example, Patent Document 1). The semiconductor device disclosed in Patent Document 1 includes a semiconductor substrate and wiring layers formed on the semiconductor substrate.

The resistive element is formed on the wiring layers. The resistive element is composed of repeating patterns of a first conductive part, a second conductive part, and an interlayer conductive part connecting the first conductive part and the second conductive part. In cross-sectional view along the semiconductor substrate, cross-sectional shape of the interlayer conductive part (hereinafter also referred to as "via") is a substantially circular shape.

In the resistive element of the semiconductor device described in Patent Document 1, if the amount of current flowing through the resistive element is too large, metallic atoms constituting the via move, and defects occur in the via, that is, so-called electromigration occurs in some cases. As a result, a characteristic of the resistive element is deteriorated. As described above, in the conventional semiconductor device, there is a room for improvement from a viewpoint of improving reliability of the semiconductor device.

It is a problem of embodiments to improve the reliability of the semiconductor device. Other problems and novel features will become apparent from the description of the specification and drawings.

SUMMARY

The semiconductor device according to embodiments includes a base member, a multilayer wiring layer, and a first resistive element. The first resistive element is formed in the multilayer wiring layer. The first resistive element includes a first conductive part, a second conductive part and a third conductive part. The second conductive part is formed over the first conductive part. The third conductive part electrically connects the first conductive part and the second conductive part with each other. A length of the third conductive part in a first direction along the surface of the base member is greater than a length of the third conductive part in a second direction along the surface of the base member and perpendicular to the first direction.

According to embodiments, a characteristic of the semiconductor device can be improved.

DETAILED DESCRIPTION

Figure 1:
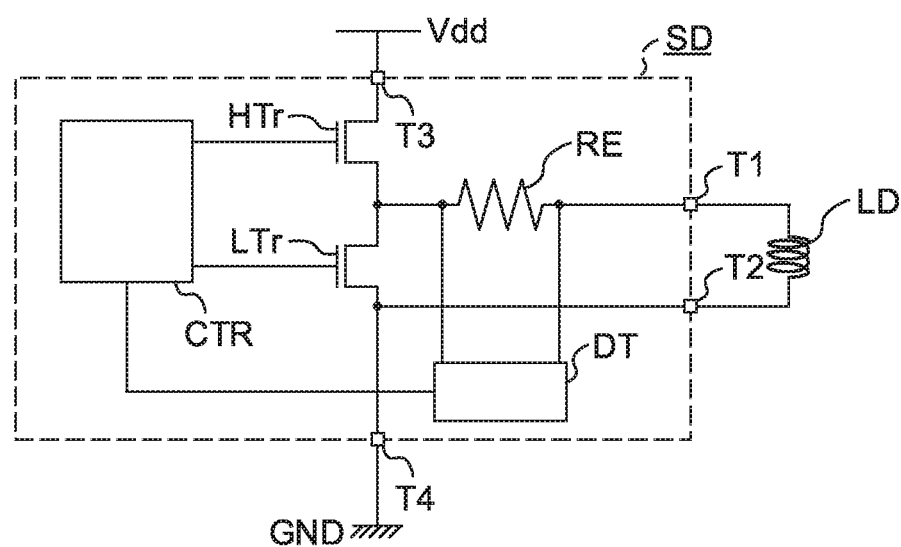
FIG. 1 is a circuit diagram showing an exemplary circuit configuration of a semiconductor device according to an embodiment.

Hereinafter, a semiconductor device according to an embodiment will be described in detail by referring to the drawings. In the specification and drawings, the same or corresponding elements are denoted by the same reference numerals or hatching, and a repetitive description thereof is omitted. In the drawings, for convenience of description, configurations may be omitted or simplified. A cross-sectional view may be illustrated as an end view. At least some of the embodiments and each modification may be arbitrarily combined with each other.

(Circuit Configuration of Semiconductor Device)

FIG. 1 is a circuit diagram illustrating an exemplary circuit configuration of a semiconductor device SD according to a present embodiment.

As shown in FIG. 1, the semiconductor device SD includes a control circuit CTR, a high-side transistor HTr, a low-side transistor LTr, a resistive element RE, and a detection circuit DT. The semiconductor device SD is coupled with a load LD via a terminal T1 and a terminal T2.

The control circuit CTR is coupled with the high-side transistor HTr, the low-side transistor LTr, and the detection circuit DT. The control circuit CTR controls the operation of the high-side transistor HTr and the low-side transistor LTr. The control circuit CTR controls the operation of the high-side transistor HTr and the low-side transistor LTr based on the signal received from the detection circuit DT. The control circuit CTR includes, for example, a feedback circuit.

The high-side transistor HTr is coupled between a power supply line Vdd and a ground line GND. The high-side transistor HTr is coupled with the power supply line Vdd via a terminal T3. The high-side transistor HTr is electrically coupled closer to the power supply potential Vdd than the low-side transistor LTr. The high-side transistor HTr controls the connection state between the power supply line Vdd and the resistive element RE.

The low-side transistor LTr is coupled between the power supply line Vdd and the ground line GND. The low-side transistor LTr is coupled to the ground line GND via a terminal T4. The low-side transistor LTr is electrically coupled closer to the ground potential GND than the high-side transistor HTr. The high-side transistor HTr controls the connection state between the ground line GND and the resistive element RE.

The resistive element RE is commonly coupled with the high-side transistor HTr and the low-side transistor LTr. The resistive element RE is coupled between the high-side transistor HTr and the load LD. The resistive element RE is coupled between the low-side transistor LTr and the load LD.

The detection circuit DT is coupled with one end of the resistive element RE and the other end of the resistive element RE. The detection circuit DT detects the amount of current flowing through the resistive element RE. For example, the detection circuit DT detects the amount of current based on a potential difference (voltage drop) between one end of the resistive element RE and the other end of the resistive element RE. A configuration of the detection circuit DT is not particularly limited as long as the above-described function is exhibited. The detection circuit DT includes, for example, an amplification circuit and an A/D conversion circuit.

The load LD is coupled between the resistive element RE and the ground line GND. The load LD is not particularly limited. For example, the load LD is a coil constituting a solenoid coil. In present embodiment, the loads LD is a coil.

Here, an exemplary operation of the semiconductor device SD will be described.

First, the control circuit CTR controls the high-side transistor HTr to be in the ON state and controls the low-side transistor LTr to be in the OFF state. Thus, the power supply potential is supplied from the power supply line Vdd to the resistive element RE and the load LD via the high-side transistor HTr. That is, a current in a forward direction flows through the resistive element RE and the load LD. At this time, a voltage drop occurs in the resistive element RE. The detection circuit DT detects the voltage drop and generates a feedback signal corresponding to the amount of current flowing through the resistive element RE. The feedback signal is transmitted to the control circuit CTR. The control circuit CTR controls the operation of the high-side transistor HTr and the low-side transistor LTr based on the feedback signal received.

For example, the control circuit CTR controls the high-side transistor HTr to the OFF state and controls the low-side transistor LTr to the ON state. Thus, the ground potential is supplied from the ground line GND to the resistive element RE and the load LD via the low-side transistor LTr. That is, the current in the forward direction flows through the resistive element RE and the load LD. Also, in the instance, a voltage drop occurs in the resistive element RE. The detection circuit DT detects the voltage drop and transmits the feedback signal to the control circuit CTR as described above.

[Configuration of Semiconductor Device]

Figure 2:
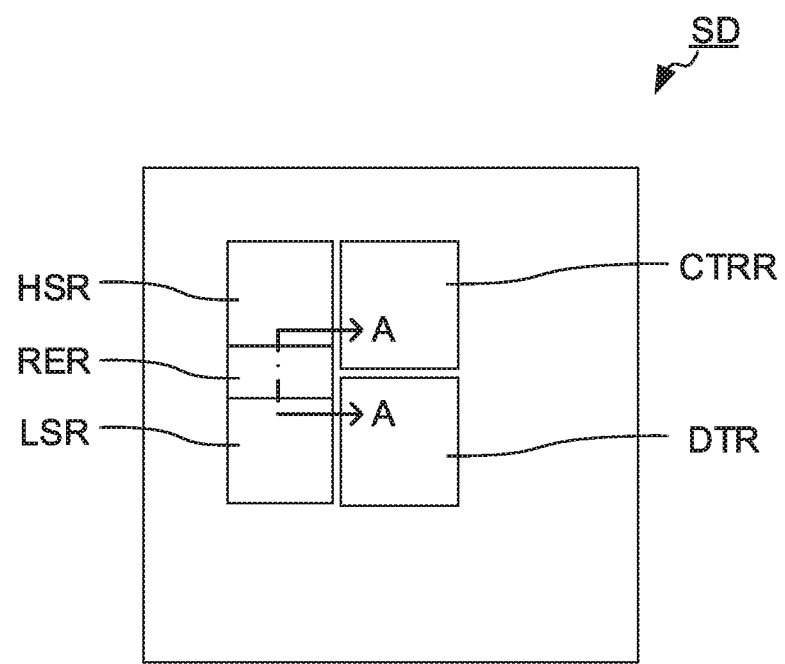
FIG. 2 is a plan view showing an exemplary configuration of the semiconductor device according to the embodiment.

FIG. 2 is a plan view showing an exemplary configuration of the semiconductor device SD according to the present embodiment. FIG. 2 shows an exemplary layout of the configuration of the semiconductor device SD for realizing the circuit configuration of the semiconductor device SD.

As shown in FIG. 2, the semiconductor device SD includes a high-side region HSR, a low-side region LSR, a resistive element region RER, a control circuit region CTRR, and a detection circuit region DTR.

The high-side region HSR is a region in which the high-side transistor HTr is formed. A type of high-side transistor HTr is not particularly limited. For example, the high-side transistor HTr is a laterally diffused metal-oxide-semiconductor (LDMOS).

The low-side region LSR is a region in which the low-side transistor LTr is formed. A type of the low-side transistor LTr is not particularly limited. For example, the low-side transistor LTr is a LDMOS.

The resistor element region RER is a region in which a resistive element RE for current detection is formed. The position of the resistive element region RER is not particularly limited. The resistance element region RER is preferably located between the high-side region HSR and the low-side region LSR in plan view. As a result, the region between the high side region HSR and the low side region LSR is effectively used. As a result, semiconductor device SD may be miniaturized. In addition, since the resistive element RE is formed near the high-side transistor HTr and the low-side transistor LTr, the parasitic resistance is reduced and an accuracy of current detection by the resistive element RE is increased.

The control circuit region CTRR is a region in which the control circuit CTR is formed. The position of the control circuit region CTRR is not particularly limited. In present embodiment, the control circuit region CTRR is formed such that the control circuit region CTRR is adjacent to one side of the high-side region HSR and a portion of one side of the resistive element region RER in a plan view.

The detection circuit region DTR is a region in which the detection circuit DT is formed. The position of the detection circuit region DTR is not particularly limited. In present embodiment, the detection circuit region DTR is formed such that the detection circuit region DTR is adjacent to one side of the low side region LSR and another portion of the one side of the resistive element region RER in plan view.

(Configuration of Main Portion of Semiconductor Device)

Here, a configuration of a main portion of the semiconductor device SD will be described in detail.

Figure 3:
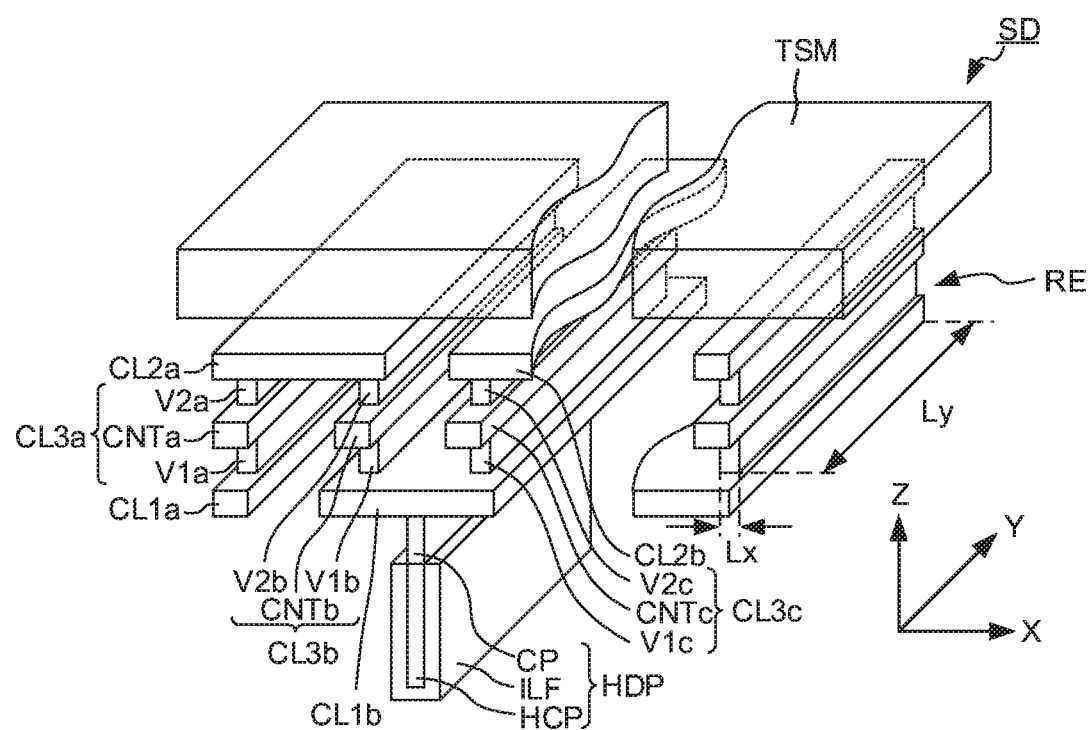
FIG. 3 is a perspective view showing an exemplary configuration of a main portion of the semiconductor device according to the embodiment.
Figure 4:
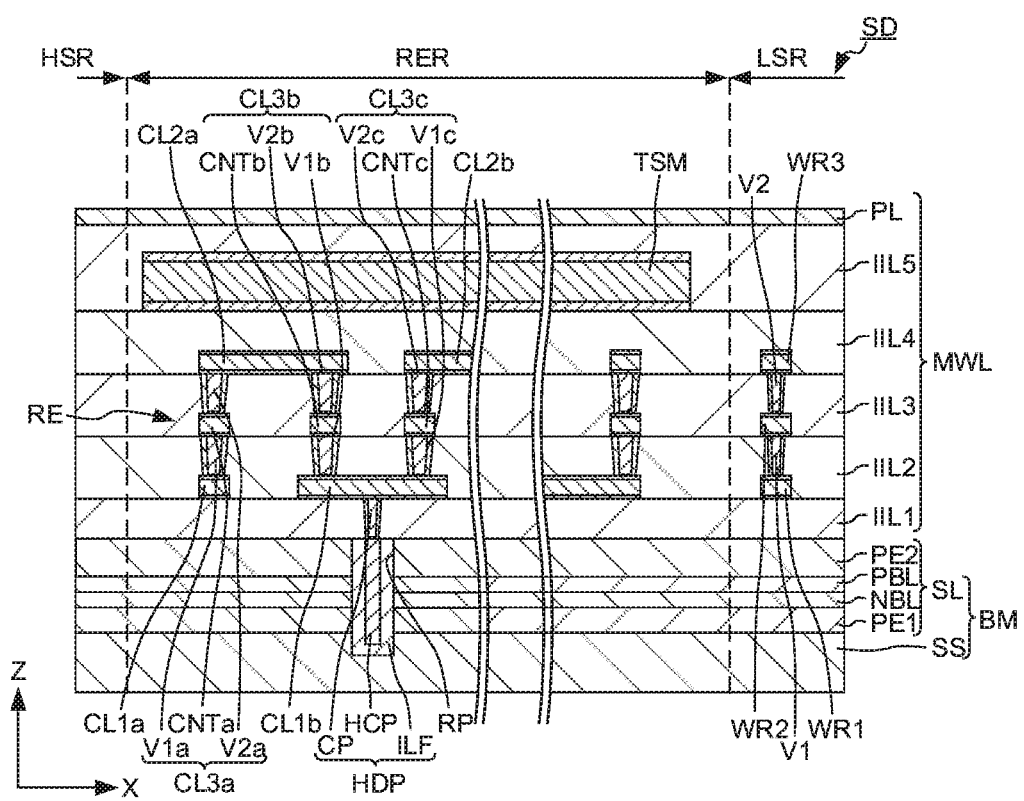
FIG. 4 is a cross-sectional view showing an exemplary configuration of the main portion of the semiconductor device according to the embodiment.

FIG. 3 is a perspective view showing an exemplary configuration of the main portion of the semiconductor device SD. FIG. 4 is a cross-sectional view showing an exemplary configuration of the main portion of the semiconductor device SD. FIG. 4 is a cross-sectional view taken along line A-A in FIG. 2. Note that in FIG. 3, a base member BM and a multilayer wiring layer MWL are omitted from a viewpoint of ease of viewing.

The semiconductor device SD includes a base member BM, a multilayer wiring layer MWL, a heat dissipation part HDP, a resistive element RE, and a thermal stress mitigating part TSM.

The base member BM includes semiconductor substrate SS and semiconductor layer SL. The base member BM supports the multilayer wiring layer MWL. A portion of the heat dissipation part HDP is formed in the base member BM. A recess portion RP is formed in the base member BM. More specifically, the recess portion RP penetrates the semiconductor layer SL such that the recess portion RP reaches the semiconductor substrate SS in the thickness direction of the base member BM. A part of the heat dissipation part HDP is formed in the recess portion RP. As a result, the shape, size, and position of a portion of the heat dissipation part HDP are defined.

The semiconductor substrate SS is, for example, p-type semiconductor substrate containing p-type impurities or n-type semiconductor substrate containing n-type impurities. Examples of the p-type impurities include boron (B)

and aluminum (Al). Examples of the n-type impurity include arsenic (As) and phosphorus (P).

The semiconductor layer SL includes a first p-type epitaxial layer PE1, an n-type buried layer NBL, a p-type buried layer PBL, and a second p-type epitaxial layer PE2. The first p-type epitaxial layer PE1, the n-type buried layer NBL, the p-type buried layer PBL, and the second p-type epitaxial layer PE2 are formed in this order from the semiconductor substrate SS-side. The semiconductor layer SL is formed on the semiconductor substrate SS. The n-type buried layer NBL and the p-type buried layer PBL are not essential constituent elements. From a viewpoint of electrically insulating between the semiconductor substrate SS and the semiconductor elements formed over the n-type buried layer NBL and the p-type buried layer PBL in the semiconductor layer SL, the semiconductor layer SL preferably includes an n-type buried layer NBL or a p-type buried layer PBL.

The first p-type epitaxial layer PE1 is an epitaxial layer formed on the surfaces of the semiconductor substrate SS. The first p-type epitaxial layer PE1 contains the p-type impurity. The impurity concentration of the first p-type epitaxial layer PE1 is, for example, $1 \times 10^{13}$ cm$^{-3}$ or more, and $1 \times 10^{19}$ cm$^{-3}$ or less, preferably is $1 \times 10^{13}$ cm$^{-3}$ or more, and $1 \times 10^{16}$ cm$^{-3}$ or less.

The n-type buried layer NBL is formed on a portion or all of the first p-type epitaxial layer PE1. Examples of the n-type impurities include phosphorus (P), arsenic (As), and antimony (Sb). The impurity concentration of the n-type buried layer NBL is, for example, $1 \times 10^{13}$ cm$^{-3}$ or more, and $1 \times 10^{20}$ cm$^{-3}$ or less.

The p-type buried layer PBL is formed, for example, on a portion or all of the n-type buried layer NBL. The impurity concentration of the p-type buried layer PBL is, for example, $1 \times 10^{15}$ cm$^{-3}$ or more, and $1 \times 10^{21}$ cm$^{-3}$ or less, and is preferably $1 \times 10^{15}$ cm$^{-3}$ or more, and $1 \times 10^{18}$ cm$^{-3}$ or less.

The second p-type epitaxial layer PE2 is an epitaxial layer formed on the p-type buried layer PBL. In a portion in which the n-type buried layer NBL and the p-type buried layer PBL are not formed, the second p-type epitaxial layer PE2 is formed on the first p-type epitaxial layer PE1. The second p-type epitaxial layer PE2 contains the p-type impurity. The impurity concentration of the second p-type epitaxial layer PE2 is, for example, $1 \times 10^{13}$ cm$^{-3}$ or more, and $1 \times 10^{19}$ cm$^{-3}$ or less, is preferably $1 \times 10^{13}$ cm$^{-3}$ or more, and $1 \times 10^{16}$ cm$^{-3}$ or less.

The multilayer wiring layer MWL is formed on the base member BM such that the multilayer wiring layer MWL covers the semiconductor elements formed on the base member BM. The multilayer wiring layer MWL is constituted by two or more wiring layers. The wiring layer is a layer including an interlayer insulating layer and one or both of a wiring and a via that are formed in the interlayer insulating layer. The via is a conductive member that electrically connects two wirings formed in layers that differ from each other.

As shown in FIG. 4, the multilayer wiring layer MWL includes a first interlayer insulating layer IIL1, a first wiring WR1, a second interlayer insulating layer IIL2, a first via V1, a second wiring WR2, a third interlayer insulating layer IIL3, a second via V2, a third wiring WR3, a fourth interlayer multilayer wiring layer IIL4, a fifth interlayer insulating layer IIL5, and a protective layer PL. As will be described in detail later, a portion of the heat dissipation part HDP, the resistive element RE, and the thermal stress mitigating part TSM are formed in the multilayer wiring layer MWL.

The first interlayer insulating layer IIL1, the second interlayer insulating layer IIL2, the third interlayer insulating layer IIL3, the fourth interlayer insulating layer IIL4, and the fifth interlayer insulating layer IIL5 are formed in this order on the base member BM. Examples of materials for each of the first interlayer insulating layer IIL1, the second interlayer insulating layer IIL2, the third interlayer insulating layer IIL3, the fourth interlayer insulating layer IIL4, and the fifth interlayer insulating layer IIL5 include silicon oxide. A thickness of each of the first interlayer insulating layer IIL1, the second interlayer insulating layer IIL2, the third interlayer insulating layer IIL3, the fourth interlayer insulating layer IIL4, and the fifth interlayer insulating layer IIL5 is not particularly limited.

The first wiring WR1 is formed on the first interlayer insulating layer IIL1. For the first wiring WR1, a well-known configuration adopted as a wiring in the semiconductor technology can be adopted. The first wiring WR1 is, for example, a stacked film in which a barrier metal, a conductive film, and a barrier metal are laminated in this order. Examples of materials of the barrier metal include titanium (Ti), titanium nitride (TiN), tantalum (Ta) and tantalum nitride (TaN). Examples of materials of the conductive film include aluminum, copper, and tungsten.

The first via V1 is formed in the second interlayer insulating layer IIL2 such that the first via V1 reaches the first wiring WR1. In the cross-section along a surface of the base member BM, the cross-sectional shape of the first via V1 is a substantially circular shape. As the configuration of the first via V1, a known configuration adopted as a via in the semiconductor technology can be adopted. The first via V1 includes, for example, a barrier film and a conductive film formed on the barrier film. Examples of materials for the barrier film include titanium (Ti), titanium nitride (TiN), tantalum (Ta) and tantalum nitride (TaN). The material of the conductive film is, for example, tungsten (W), aluminum (Al), or copper (Cu).

The second wiring WR 2 and the third wiring WR3 are similar to the wiring WR1, except for the positions formed in the multilayer wiring layer MWL. The second via V2 is also similar to the first via V1, except for the position formed in the multilayer wiring layer MWL.

The protective layer PL is a layer that protects the semiconductor device SD from external moisture and the like. The protective layer PL is formed on the fifth interlayer insulating layer IIL5. The protective layer PL is formed in the uppermost layer of the multilayer wiring layer MWL within the multilayer wiring layer MWL. The protective layer PL may be a single layer film or a stacked film of two or more layers. Examples of the protective layer PL include a silicon oxide film, a silicon oxynitride film, a silicon nitride film, a Phospho Silicate Glass (PSG) film, and a stacked film of these films. A thickness of the protective layer PL is, for example, 1.0 μm or more, and 2.0 μm or less, and preferably about 1.5 μm.

In the multilayer wiring layer MWL, a portion of the heat dissipation part HDP, the resistive element RE, and the thermal stress mitigating part TSM are formed. In the base member BM, a remaining portion of the heat dissipation part HDP is formed. Details of these elements will be described below.

The heat dissipation part HDP has an insulating film ILF, a heat conduction part HCP, and a coupling part CP. The heat dissipation part HDP is configured to transmit heat generated in the resistive element RE to the outside of the multilayer wiring layer MWL. For example, a portion of the heat dissipation part HDP may be formed in the multilayer wiring layer MWL, and another portion of the heat dissipation part HDP may be exposed from the multilayer wiring layer MWL. In present embodiment, the portion of the heat dissipation part HDP is formed in the multilayer wiring layer MWL, and the remaining portion of the heat dissipation part HDP is formed in the base member BM. Thereby, the heat generated in the resistive element RE is transferred to the base member BM via the heat dissipation part HDP.

The insulating film ILF is formed on a bottom surface and side surfaces of the recess portion RP formed on the surface of the base member BM. The insulating film ILF suppresses short-circuiting of the heat conduction part HCP and the base member BM with each other. A thickness of the insulating film ILF is not particularly limited as long as the above-described function can be obtained. The thickness of the insulating film ILF is, for example, about 0.1 μm. The material of the insulating film ILF is, for example, silicon oxide.

The heat conduction part HCP is formed on the insulating film ILF such that the heat conduction part HCP fills the inside of the recess portion RP. The heat conduction part HCP is made of a material having heat conductivity. From a viewpoint of enhancing the thermal conductivity, examples of the material of the thermal conduction part HCP preferably include titanium (Ti), titanium nitride (TiN), tantalum (Ta) and tantalum nitride (TaN) and tungsten (W).

From a viewpoint of enhancing the heat dissipation property, a size of the heat conduction part HCP is preferably large. The heat conduction part HCP preferable reaches the p-type buried layer PBL, more preferably reaches the n-type buried layer NBL, still more preferably reaches the first p-type epitaxial layer PE1, and still more preferably reaches the semiconductor substrate SS of the base member BM.

From a viewpoint of enhancing the heat dissipation property, a shape of the heat conduction part HCP is preferably a plate shape. That is, a length of the heat conduction part HCP in the Y direction is preferably greater than a length of the heat conduction part HCP in the X direction. The length of the heat conduction part HCP in the Y direction is preferably greater than a length of the resistive element RE in the Y direction. In present embodiment, the length of the heat conduction part HCP in the Y direction is approximately the same as the length of the resistive element RE in the Y direction.

In this specification, the "Y direction" is a first direction along the surface (upper surface, main surface) of the base member BM. The Y direction is also a direction in which a long side of the third conductive part CL3a (described later) extends in plan view. The "X direction" is a second direction perpendicular to the Y direction in a plan view. The Y direction is also a direction in which the short sides of the third conductive part CL3a (described later) extend in plan view. The "Z direction" is the thickness direction of the multilayer wiring layer MWL. The X direction, Y direction, and Z direction are orthogonal to each other.

The coupling part CP is formed in the first interlayer insulating layer IIL1 such that the coupling part CP directly contacts with the resistive element RE. It is preferable that the coupling part CP directly contacts with the resistive element RE from a viewpoint of enhancing the heat dissipation by the heat dissipation part HDP. The coupling part CP is made of a material having thermal conductivity. The coupling part CP may have, for example, the same configuration as a via (not shown) formed in the first interlayer insulating layer IIL1, or may have a different configuration. The coupling part CP includes, for example, a barrier film and a conductive film formed on the barrier film. Examples of materials for the barrier film include titanium (Ti), titanium nitride (TiN), tantalum (Ta) and tantalum nitride (TaN). The material of the conductive film is, for example, tungsten (W), aluminum (Al), or copper (Cu).

From a viewpoint of enhancing the heat dissipation property, it is preferable that a shape of the coupling part CP is a so-called slit shape. That is, a length of the coupling part CP in the Y direction is preferably greater than a length of the coupling part CP in the X direction. In present embodiment, the length of the coupling part CP in the Y direction is about the same as a length of the first conductive part CL1b in the Y direction.

The resistive element RE is formed in the multilayer wiring layer MWL. The use of the resistive element RE is not particularly limited. In present embodiment, the resistive element RE is so-called sense resistor used to detect current at desired position in semiconductor device SD.

The resistive element RE includes first conductive part CL1a, CL1b, second conductive part CL2a, CL2b and third conductive part CL3a, CL3b, CL3c. The first conductive part CL1a, the third conductive part CL3a, the second conductive part CL2a, the third conductive part CL3b, the first conductive part CL1b, the third conductive part CL3c and the second conductive part CL2b are connected with each other in this order.

The number of the first conductive part, the second conductive part, and the third conductive part constituting the resistive element RE are appropriately adjusted in accordance with desired resistance value. The first conductive part CL1a and the first conductive part CL1b are similar to each other except for the position and the size. The second conductive part CL2a and the second conductive part CL2b are also similar each other except for the position. The third conductive part CL3a, third conductive part CL3b and the third conductive part CL3c are also similar each other except for the position. From a viewpoint of omitting duplicate descriptions, only the first conductive part CL1a, second conductive part CL2a and the third conductive part CL3a will be described below.

The first conductive part CL1a is formed in the multilayer wiring layer MWL. The first conductive part CL1a is formed in the same layer as the layer in which the first wiring WR1 is formed in the multilayer wiring layer MWL. In present embodiment, the first conductive part CL1a is formed on the first interlayer insulating layer IIL1.

The shape, size, and material of the first conductive part CL1a are appropriately adjusted accordance with desired resistance value and occupied area. A length of the first conductive part CL1a in the Y direction is preferably greater than a length of the first conductive part CL1a in the X direction. The first conductive part CL1a may have, for example, the same configuration as the first wiring WR1 formed in the same layer, or may have a different configuration. The first conductive part CL1a is, for example, a stacked film in which a barrier film, a conductive film, and a barrier film are stacked in this order. Examples of materials for the barrier film include titanium (Ti), titanium nitride (TiN), tantalum (Ta) and tantalum nitride (TaN). Examples of the materials of the conductive film include Aluminum, copper and tungsten. In present embodiment, the first conductive part CL1a is aluminum wiring.

The second conductive part CL2a is formed in multilayer wiring layer MWL. The second conductive part CL2a is formed in the same layer as the layer in which the third wiring WR3 is formed in the multilayer wiring layer MWL. In present embodiment, the second conductive part CL2a is formed on the third interlayer insulating layer IIL3.

In addition, the second conductive part CL2a is formed over the first conductive part CL1a. That is, a distance between the second conductive part CL2a and the surface of the base member BM in the Z direction is greater than a distance between the first conductive part CL1a and the surface of the base member BM in the Z direction. A portion of the second conductive part CL2a is formed such that the portion overlaps with a portion of the first conductive part CL1a in a plan view. It is preferable that the second conductive part CL2a is formed along the first conductive part CL1a in a plan view.

The shape, size and material of the second conductive part CL2a are appropriately adjusted accordance with desired resistance value and occupied area. The shape, size, and material of the second conductive part CL2a may be the same as or different from the shape, size, and material of the first conductive part CL1a, respectively. In present embodiment, a length of the second conductive part CL2a in the X direction is greater than a length of the first conductive part CL1a in the X direction, and a length of the second conductive part CL2a in the X direction is about the same as a length of the first conductive part CL1b in the X direction.

The third conductive part CL3a is formed between the first conductive part CL1a and the second conductive part CL2a in the multilayer wiring layer MWL. The third conductive part CL3a electrically connect the first conductive part CL1a and the second conductive part CL2a with each other. The third conductive part CL3a penetrates the interlayer insulating layer IIL2 and the interlayer insulating layer IIL3, which are sandwiched between the first conductive part CL1a and the second conductive part CL2a.

The third conductive part CL3a includes a first via V1a, a connecting part CNTa, and a second via V2a. The configuration of the first via V1a and the configuration of the second via V2a are similar each other except for the position. From a viewpoint of omitting duplicate description, only the first via V1a will be described below. The third conductive part CL3b includes a first via V1b, a connecting part CNTb, and a second via V2b. The third conductive part CL3c include a first via V1c, a connecting part CNTc, and a second via V2c.

The first via V1a is formed in the multilayer wiring layer MWL. The first via V1a is formed on the first conductive part CL1a. The first via V1a is formed in the same layer as the layer in which the first via V1 is formed in the multilayer wiring layer MWL. In present embodiment, the first via V1a is formed in the second interlayer insulating layer IIL2.

A length Ly of the first via V1a in the Y direction is greater than a length Lx of the first via V1a in the X direction. As a result, compared with the first via V1 having a substantially circular cross-sectional shape, even if a large current flows through the first via V1a, defects caused by electromigration are less likely to occur in the first via V1a. From this viewpoint, a ratio (Ly/Lx) of the Ly to the Lx is preferably 50 or more, and more preferably 1000 or more. The ratio (Ly/Lx) is not particularly limited, and is appropriately adjusted depending on the magnitude of the current.

On the other hand, from a viewpoint of downsizing the semiconductor device SD, the Ly/Lx is preferably 5000 or less, and more preferably 2000 or less.

From a viewpoint of enhancing the electromigration resistance, it is preferable that the length Lx (short width) of the first via V1a in the X direction be greater than the length (diameter) of the first via V1 in the X direction. The first via V1 is formed in one or both of the high side region HSR and the low side region LSR.

The size and material of the first via V1a are appropriately adjusted in accordance with a desired resistance value. Further, the configuration of the first via V1a may be the same as or different from the first via V1 formed in the second interlayer insulating layer IIL2, for example. The first via V1 includes, for example, a barrier film and a conductive film formed on the barrier film. Examples of materials for the barrier film include titanium (Ti), titanium nitride (TiN), tantalum (Ta) and tantalum nitride (TaN). The material of the conductive film is, for example, tungsten (W), aluminum (Al), or copper (Cu).

The connecting part CNTa connects the first via V1a and the second via V2a in the multilayer wiring layer MWL with each other. In present embodiment, the connecting part CNTa is formed on the second interlayer insulating layer IIL2. From a viewpoint of suppressing variation in resistance value of the resistive element RE, it is preferable that the connecting part CNTa is formed between the first via V1a and the second via V2a. More specifically, since the third conductive part CL3a includes the connecting part CNTa, even if the positional deviation of the first via V1a and the second via V2a occurs, variations in resistance values of the resistive element REs can be suppressed.

The shape and size of the connecting part CNTa are appropriately adjusted accordance with desired resistances value. A configuration of the connecting part CNTa may be the same as or different from the wiring WR2 formed on the second interlayer insulating layer IIL2, for example. An example of the configuration of the connecting part CNTa is the same as the example of the configuration of the first conductive part CL1a.

The thermal stress mitigating part TSM is formed in the multilayer wiring layer MWL. The thermal stress mitigating part TSM is formed between the resistive element RE and the protective layer PL. The thermal stress mitigating part TSM is configured to suppress stress caused by heat from outside the multilayer wiring layer MWL from being applied to the resistive element RE. More specifically, the thermal stress mitigating part TSM mitigates a stress applied to the resistive element RE due to the difference between a thermal expansion coefficient of the resistive element RE and a thermal expansion coefficient of the interlayer insulating layer constituting the multilayer wiring layer MWL. The thermal stress mitigating part TSM preferably overlaps at least a portion of the resistive element RE in plan view. From a viewpoint of enhancing the heat insulating property, it is more preferable that the thermal stress mitigating part TSM overlaps with all of the resistive element RE in plan view. From a viewpoint of enhancing the heat insulating property, it is preferable that the thermal stress relieving portion TSM is formed so as to surround the resistance element RE. For example, it is more preferable that the thermal stress mitigating part TSM overlaps all of the resistive element RE in a side view, more preferable that the thermal stress mitigating part TSM overlaps all of the resistive element RE in a front view, and more preferable that the thermal stress mitigating part TSM overlaps all of the resistive element RE in a rear view. In the present embodiment, the thermal stress mitigating part TSM overlaps all of the resistive element RE in plan view.

A configuration of the thermal stress mitigating part TSM may be the same as or different from, for example, a wiring (not shown) formed on the fourth interlayer insulating layer IIL4. The thermal stress mitigating part TSM includes a barrier film and a conductive film formed on the barrier film. Examples of materials for the barrier film include titanium (Ti), titanium nitride (TiN), tantalum (Ta) and tantalum nitride (TaN). The material of the conductive film is, for example aluminum (Al), or copper (Cu).

(Method of Manufacturing Semiconductor Device)

Figure 5:
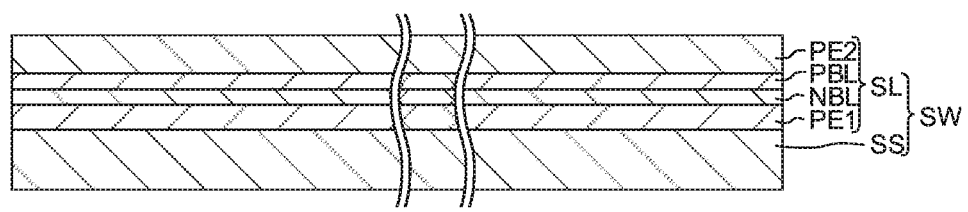
FIG. 5 is a cross-sectional view showing an exemplary step included in a method of manufacturing the semiconductor device according to the embodiment.
Figure 6:
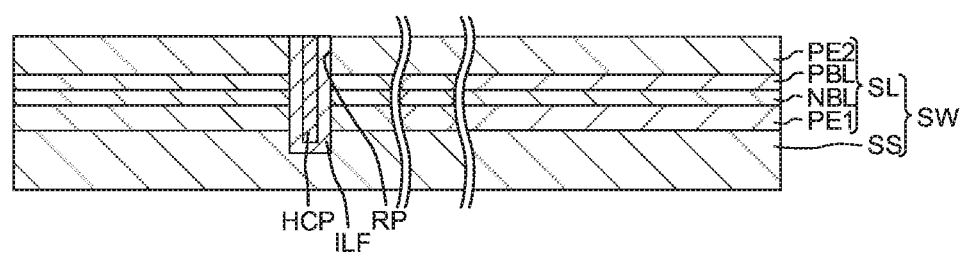
FIG. 6 is a cross-sectional view showing an exemplary step included in the method of manufacturing the semiconductor device according to the embodiment.
Figure 7:
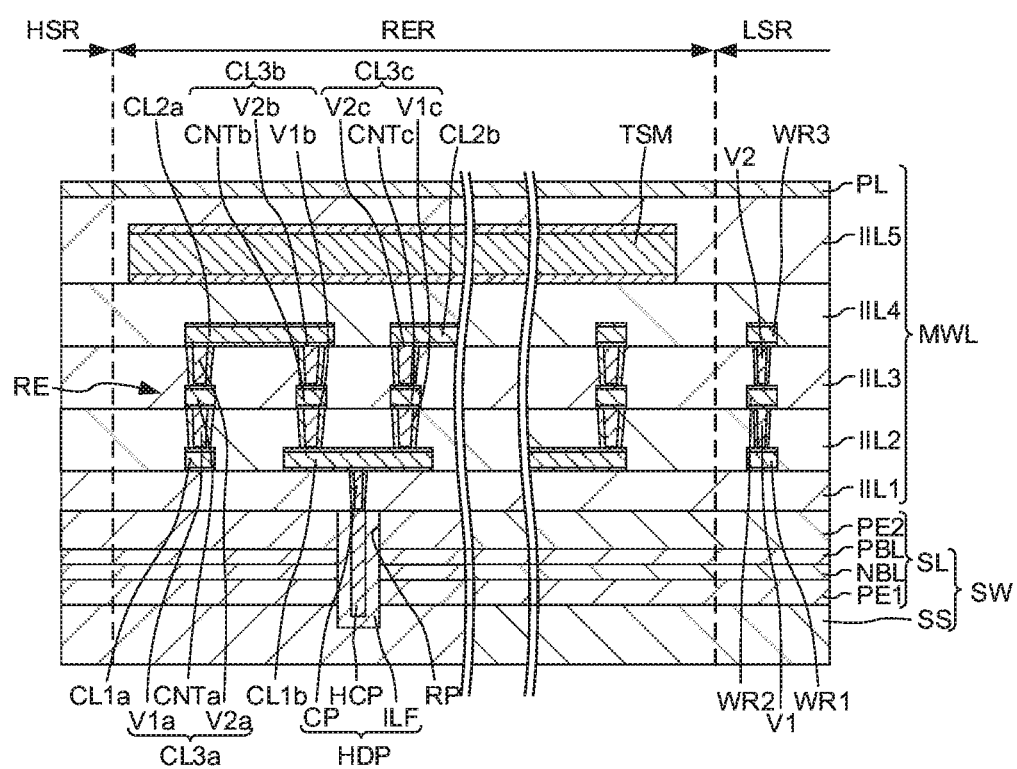
FIG. 7 is a cross-sectional view showing an exemplary step included in the method of manufacturing the semiconductor device according to the embodiment.

Next, an exemplary method of manufacturing the semiconductor device SD according to present embodiment will be described. FIGS. 5 to 7 are respectively a cross-sectional view showing an exemplary step included in the method of manufacturing the semiconductor device SD.

The method of manufacturing the semiconductor device SD includes, for example, (1) a step of providing a semiconductor wafer SW, (2) a step of forming a portion of the heat dissipation part HDP, (3) a step of forming the multilayer wiring layer MWL, the remaining part of the heat dissipation part HDP, and a step of forming the heat stress mitigating part TSM.

(1) Providing of the Semiconductor Wafer SW

First, as shown in FIG. 5, the semiconductor wafer SW is provided. The semiconductor wafer SW may be purchased as a commercial product or may be manufactured. The semiconductor wafer SW includes a semiconductor substrate SS, and a semiconductor layer SL constituted by the first p-type epitaxial layer PE1, the n-type buried layer NBL, the p-type buried layer PBL, and the second p-type epitaxial layer PE2. Each layer of the semiconductor wafer SW is formed by, for example, forming an epitaxial layer on the semiconductor substrate SS by an epitaxial growth method, and implanting a desired impurity into a desired position of the epitaxial layer.

(2) Formation of a Portion of the Heat Dissipation Part HDP

Next, as shown in FIG. 6, the insulating film ILF and the heat conduction part HCP are formed in the semiconductor wafer SW. First, after the recess portion RP is formed on the front surface (upper surface) of the semiconductor wafer SW, the insulating film ILF is formed on the bottom surface and the side surface of the recess portion RP and the upper surface of the semiconductor wafer SW. The recess portion RP is formed by, for example, photolithography and etching. The method of forming the insulating film ILF is, for example, a CVD method. Next, a heat conduction part HCP is formed on the insulating film ILF so as to fill the recess portion RP. The method of forming the heat conduction part HCP is, for example, a CVD method. Excess portions of the insulating film ILF and the heat conduction part HCP formed outside the recess portion RP are removed by, for example, the CMP method.

(3) Formation of the Multilayer Wiring Layer MWL, a Remaining Portion of Heat Dissipation Part HDP, and Thermal Stress Mitigating Part TSM Next, as shown in FIG. 7, the multilayer wiring layer MWL, the coupling part CP, and the thermal stress mitigating part TSM are formed on the semiconductor wafer SW. As a method of forming the multilayer wiring layer MWL, the coupling part CP, and the thermal stress mitigating part TSM, a method known as a method of forming the multilayer wiring layer in the semiconductor technology can be adopted.

The first interlayer insulating layer IIL1, the second interlayer insulating layer IIL2, the third interlayer insulating layer IIL3, the fourth interlayer insulating layer IIL4, and the fifth interlayer insulating layer IIL5 are formed by, for example, a CVD method. The coupling part CP is formed by, for example, forming a through hole in the first interlayer insulating layer IIL1 and then filling the through hole with a conductive material. The first via V1, V1a, V1b, V1c, for example, after forming a through-holes in the second interlayer insulating layer IIL2, is formed by filling the through-holes with a conducting material. The second via V2, V2a, V2b, V2c, for example, after forming a through-holes in the third interlayer insulating layer IIL3, is formed by filling the through-holes with a conducting material.

The first conductive parts CL1a, CL1b and the first wiring WR1 are formed by forming a conductive film on the first interlayer insulating layer IIL1 by a sputtering method, and then patterning the conductive film into a desired structure. The second conductive parts CL2a, CL2b and third wiring WR3 are formed by forming a conductive film on the third interlayer insulating layer IIL3 by a sputtering method, and then patterning the conductive film into a desired structure. The connecting parts CNTa, CNTb, CNTc and second wiring WR2 are formed by forming a conductive film on the second interlayer insulating layer IIL2 by a sputtering method, and then patterning the conductive film into a desired structure. The protective layer PL is formed on the fifth interlayer insulating layer IIL5 by a sputtering method.

Then, the structures obtained by the above steps are detached from the electrostatic chucks and diced, thereby obtaining a plurality of singulated semiconductor devices SD. Finally, the semiconductor device SD is sealed with a sealing resin.

(Effect)

The resistive element RE of the semiconductor device SD according to the present embodiment includes a third conductive part CL3a, CL3b, CL3c electrically connecting the first conductive part CL1a, CL1b and the second conductive part CL2a, CL2b with each other. The length of the third conductive part CL3a, CL3b, CL3c in the Y direction (first direction) along the surface of the base member BM is greater than the length of the third conductive part CL3a, CL3b, CL3c in the X direction (second direction) along the surface of the base member BM and perpendicular to the Y direction. In particular, the length Ly of the first via V1a, V1b, V1c in the Y direction, is greater than the length Lx of the first via V1a, V1b, V1c in the X direction. The length Ly of second via V2a, V2b, V2c in the Y direction is also greater than the length Lx of second via V2a, V2b, V2c in the X direction. As a result, the current densities in the first via V1a, V1b, V1c and the second via V2a, V2b, V2c are reduced as compared with a via whose cross-sectional shape is substantially circular. As a result, in the present embodiment, even if a large current flows through the resistive element RE, defects caused by electromigration are less likely to occur in the first via V1a, V1b, V1c and the second via V2a, V2b, V2c, as compared with the resistance element having the via whose cross-sectional shape is substantially circular. As a result, the reliability of the semiconductor device SD can be enhanced.

[First Modification]

Figure 8:
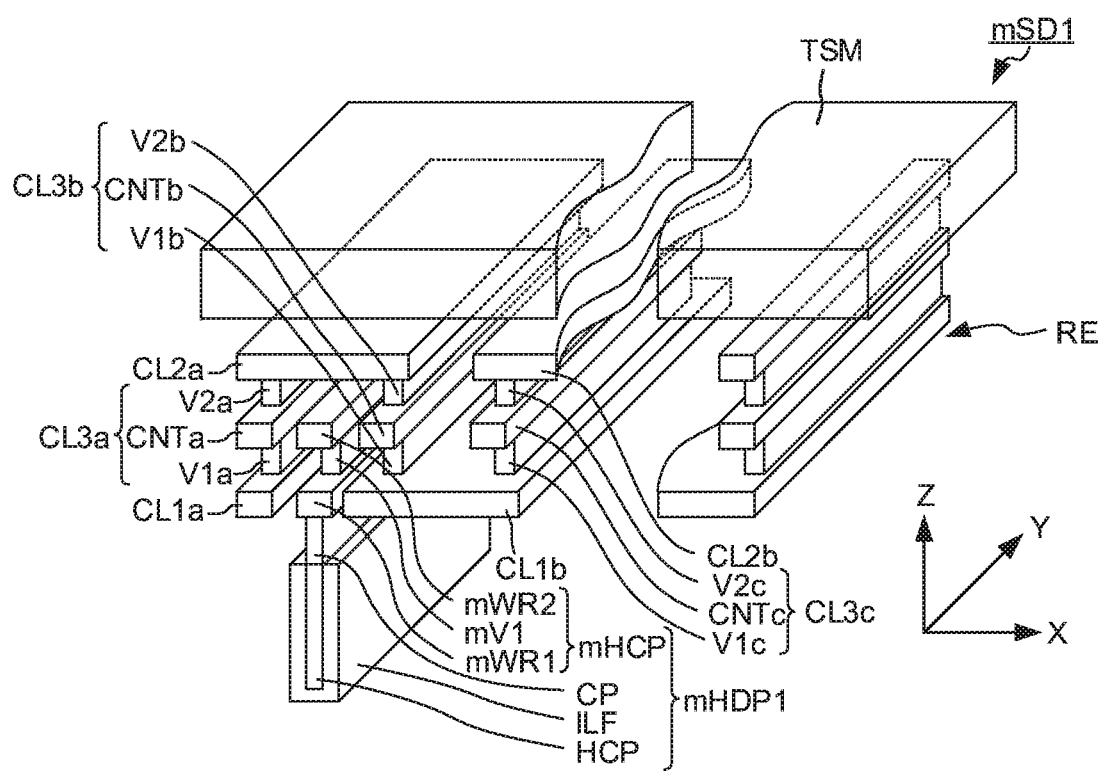
FIG. 8 is a perspective view showing an exemplary configuration of a main portion of a semiconductor device according to a first modification of the embodiment.
Figure 9:
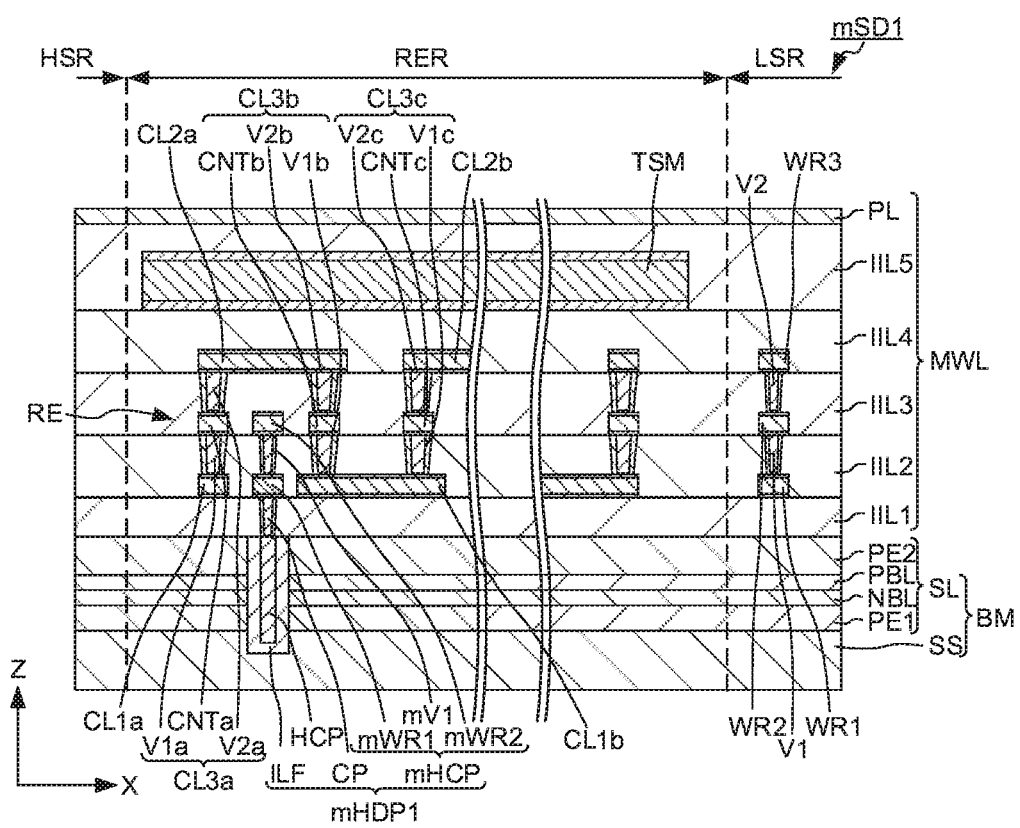
FIG. 9 is a cross-sectional view showing an exemplary configuration of the main portion of the semiconductor device according to the first modification of the embodiment.

FIG. 8 is a perspective view showing an exemplary configuration of a main portion of a semiconductor device mSD1 according to the first modification of the present embodiment. FIG. 9 is a cross-sectional view showing an exemplary configuration of the main portion of the semiconductor device mSD1.

The semiconductor device mSD1 according to first modification includes an insulating film ILF, a heat conduction part HCP, a coupling part CP, and a heat conduction portion mHCP. The heat dissipation part mHDP1 of the first modification is not directly connected with the resistive element RE. That is, the heat dissipation part mHDP1 is formed in the multilayer wiring layer MWL such that the heat dissipation part mHDP1 is spaced apart from the resistive element RE and connected with the heat conduction part mHCP.

The heat conduction part mHCP is formed by a wiring and a via formed in the multilayer wiring layer MWL. The heat conduction part mHCP is formed along the third conductive part CL3a, CL3b, CL3c. The heat conduction part mHCP includes a first wiring mWR1, a first via mV1 and a second wiring mWR2. A configuration of the first wiring mWR1 is the same as that of the first conductive part CL1a. A configuration of the first via mV1 is the same as that of the first via V1a. A configuration of the second wiring mWR2 is the same as that of the connecting part CNTa.

One end portion of the heat conduction part mHCP faces a portion of the resistive element RE in a direction along the surface of the base member BM. In first modification, the one end portion of the heat conduction part mHCP faces the first conductive part CL1a, CL1b and the third conductive part CL3a, CL3b in the X-direction. The one end portion of the heat conduction part mHCP faces the other portion of the resistive element RE in a direction perpendicular to the surface of the base member BM. In first modification, the one end portion of the heat conduction part mHCP faces the second conductive part CL2a in the Z-direction.

In first modification, since the heat dissipation part mHDP1 is spaced apart from the resistive element RE, the current from the resistive element RE can be suppressed from flowing to the heat dissipation part mHDP1. This makes it possible to achieve both heat dissipation and detection accuracy of the current value.

[Second Modification]

Figure 10:
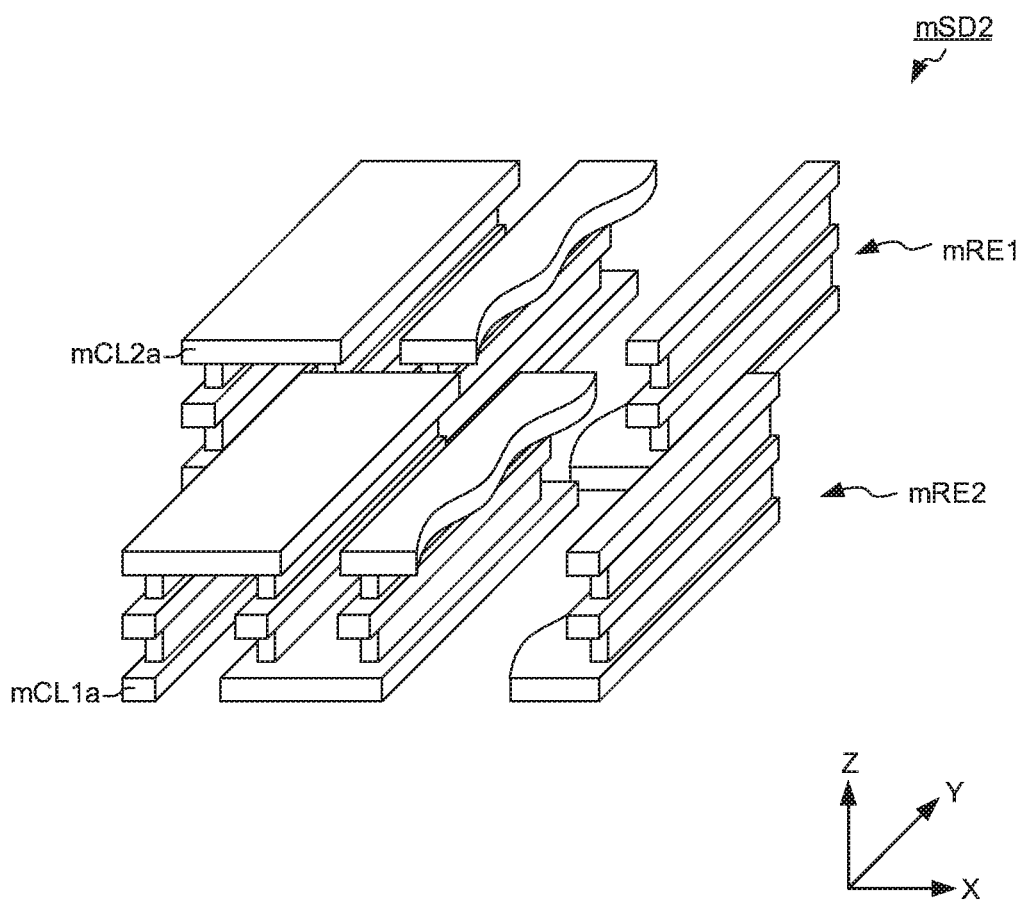
FIG. 10 is a perspective view showing an exemplary configuration of a main portion of a semiconductor device according to a second modification of the embodiment.

FIG. 10 is a perspective view showing an exemplary configuration of a main portion of a semiconductor device mSD2 according to the second modification of present embodiment.

The semiconductor device mSD2 according to second modification has a plurality of resistive elements. The number of the resistive elements is not particularly limited. The semiconductor device mSD2 according to second modification includes a first resistive element mRE1 and a second resistive element mRE2. An exemplary configuration of the first resistive element mRE1 and the exemplary configuration of the second resistive element mRE2 are the same as those of the resistive element RE. In second modification, the first conductive part mCL1a of the first resistive element mRE1 is disposed such that the first resistive element mRE1 is adjacent to the second conductive part mCL2a of the second resistive element mRE2 in plan view. As a result, the magnetic field generated by the current flowing in the first resistive element mRE1 and the magnetic field generated by the current flowing in the second resistive element mRE2 cancel each other. As a result, it is possible to suppress a change in the characteristics of the peripheral semiconductor element due to the magnetic field generated by a current flowing through the resistive element. As a result, the properties of the semiconductor device can be further enhanced.

[Third Modification]

Figure 11:
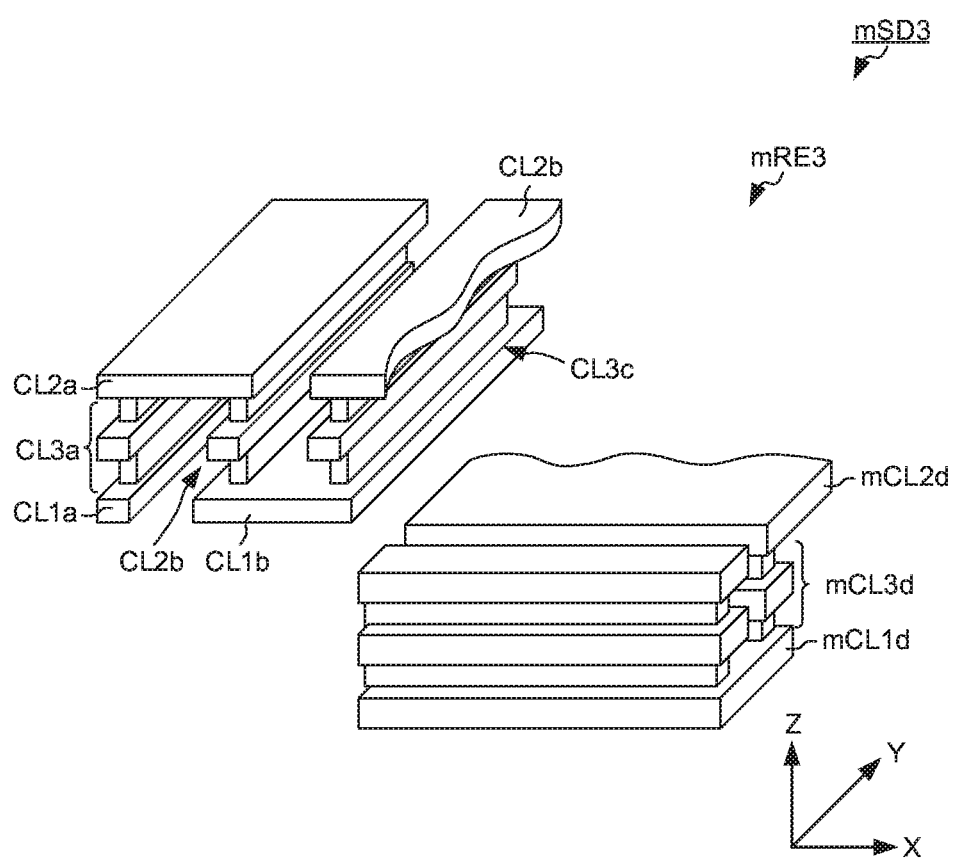
FIG. 11 is a perspective view showing an exemplary configuration of a main portion of a semiconductor device according to a third modification of the embodiment.

FIG. 11 is a perspective view showing an exemplary configuration of a main portion of semiconductor device mSD3 according to a third modification of the present embodiment.

The semiconductor device mSD3 according to the third modification includes a resistive element mRE3. The resistive element mRE3 further includes a first conductive part CL1d, second conductive part CL2d and a third conductive part CL3d. A length of the first conductive part CL1d in the Y direction is smaller than a length of the first conductive part CL1d in the X direction. A length of the second conductive part CL2d in the Y direction is smaller than a length of the second conductive part CL2d in the X direction. A length of the third conductive part CL3d in the Y direction is smaller than a length of the third conductive part CL3d in the X direction.

In third modification, the resistive element mRE3 includes a portion in which each component (first conductive part CL1a, CL1b, second conductive part CL2a, CL2b and third conductive part CL3a, CL3b, CL3c) extends along the Y direction, and a portion in which each component (first conductive part CL1d, second conductive part CL2d and third conductive part CL3d) extends along the X direction. Thereby, when the semiconductor device mSD3 is sealed with the sealing resin, when there are differences between the stress in the X direction and the stress in the Y direction, the sum of the stresses applied to the semiconductor device mSD3 can be reduced on the average.

It should be noted that the present invention is not limited to the above-mentioned embodiment, and various modifications can be made without departing from the gist thereof. For example, the third conductive part CL3 need only be able to electrically connect the first conductive part CL1a and the second conductive part CL2a with each other and need not have the connecting part CNTa.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

Further, at least a part of the embodiment and at least a part of each modification may be arbitrarily combined with each other. For example, the structure, position, and material of the heat conduction part and the heat dissipating part may be designed as appropriate.

What is claimed is:

1. A semiconductor device comprising:
   a base member;
   a multilayer wiring layer formed on the base member;
   a first resistive element formed in the multilayer wiring layer; and
   a heat dissipation part,
   wherein the first resistive element comprises:
      a first conductive part;
      a second conductive part formed over the first conductive part; and
      a third conductive part electrically connecting the first conductive part and the second conductive part with each other,
   wherein a length of the third conductive part in a first direction along a surface of the base member is greater than a length of the third conductive part in a second direction along the surface of the base member and perpendicular to the first direction,
   wherein a portion of the heat dissipation part is formed in the multilayer wiring layer,
   wherein a remaining portion of the heat dissipation part is formed in the base member,
   wherein the heat dissipation part comprises:
      a first insulating film formed on a bottom surface and a side surface of a recess portion formed on the surface of the base member; and
      a first heat conduction part formed on the first insulating film such that the first heat conduction part buries the recess portion, and wherein the heat dissipation part comprises a second heat conduction part formed in the multilayer wiring layer such that the second heat conduction part is spaced apart from the first resistive element and is connected with the first heat conduction part.

2. The semiconductor device according to claim 1, wherein the heat dissipation part comprises a first coupling part formed in the multilayer wiring layer such that the first coupling part connects the first resistive element and the first heat conduction part with each other.

3. The semiconductor device according to claim 1, wherein the second heat conduction part extends along the third conductive part in cross-sectional view.

4. The semiconductor device according to claim 1,
wherein one end portion of the second heat conduction part faces a portion of the first resistive element in the second direction along the surface of the base member, and
wherein the one end portion of the second heat conduction part faces another portion of the first resistive element in a direction perpendicular to the surface of the base member.

5. The semiconductor device according to claim 1,
wherein one end portion of the second heat conduction part faces the first conductive part and the third conductive part in a direction along the surfaces of the base member, and
wherein the one end portion of the second heat conduction part faces the second conductive part in a direction perpendicular to the surface of the base member.

6. The semiconductor device according to claim 1,
wherein the multilayer wiring layer comprises:
a protective layer formed in an uppermost layer of the multilayer wiring layer; and
a thermal stress mitigating part formed between the first resistive element and the protective layer, and
wherein the thermal stress mitigating part overlaps the first resistive element in a plan view.

7. The semiconductor device according to claim 1, comprising:
a first region in which a first transistor is formed; and
a second region in which a second transistor is formed,
wherein the first resistive element is formed between the first region and the second region in a plan view.

8. The semiconductor device according to claim 1, comprising a second resistive element formed in the multilayer wiring layer,
wherein the second resistive element comprises:
a fourth conductive part;
a fifth conductive part formed over the fourth conductive part; and
a sixth conductive part electrically connecting the fourth conductive part and the fifth conductive part with each other, and wherein a length of the sixth conductive part in the first direction is smaller than a length of the sixth conductive part in the second direction.

9. The semiconductor device according to claim 1, comprising a third resistive element formed in the multilayer wiring layer,
wherein the third resistive element comprises:
a fourth conductive part;
a fifth conductive part formed over the fourth conductive part; and
a sixth conductive part electrically connecting the fourth conductive part and the fifth conductive part with each other,
wherein the fourth conductive part, the fifth conductive part, and the sixth connection part extend in the first direction in plan view, and
wherein the first conductive part is adjacent to the fifth conductive part in plan view.

10. A semiconductor device according to claim 9, comprising:
a base member;
a multilayer wiring layer formed on the base member;
a first resistive element formed in the multilayer wiring layer; and
a heat dissipation part,
wherein the first resistive element comprises:
a first conductive part;
a second conductive part formed over the first conductive part; and
a third conductive part electrically connecting the first conductive part and the second conductive part with each other,
wherein a length of the third conductive part in a first direction along a surface of the base member is greater than a length of the third conductive part in a second direction along the surface of the base member and perpendicular to the first direction,
wherein a portion of the heat dissipation part is formed in the multilayer wiring layer,
wherein a remaining portion of the heat dissipation part is formed in the base member,
wherein the base member comprises:
a semiconductor substrate; and
a semiconductor layer formed on a surface of the semiconductor substrate,
wherein the heat dissipation part penetrates the semiconductor layer such that the heat dissipation part reaches the semiconductor substrate, and
wherein the semiconductor layer comprises:
a first epitaxial layer having a first conductivity type;
a first buried layer formed on the first epitaxial layer and having a second conductivity type opposite to the first conductivity type; and
a second epitaxial layer formed on the first buried layer and having the first conductivity type.

* * * * *